(12) United States Patent
Hanna et al.

(10) Patent No.: US 10,970,228 B2
(45) Date of Patent: Apr. 6, 2021

(54) MAPPING TABLE COMPRESSION USING A RUN LENGTH ENCODING ALGORITHM

(71) Applicant: Micron Technology, Inc., Boise, ID (US)

(72) Inventors: Stephen Hanna, Fort Collins, CO (US); Nadav Grosz, Broomfield, CO (US)

(73) Assignee: Micron Technology, Inc., Boise, ID (US)

( * ) Notice: Subject to any disclaimer, the term of this patent is extended or adjusted under 35 U.S.C. 154(b) by 10 days.

(21) Appl. No.: 16/220,608

(22) Filed: Dec. 14, 2018

(65) Prior Publication Data

US 2020/0192814 A1  Jun. 18, 2020

(51) Int. Cl.
| | |
|---|---|
| *G06F 3/00* | (2006.01) |
| *G06F 12/1009* | (2016.01) |
| *H03M 7/46* | (2006.01) |
| *G06F 3/06* | (2006.01) |
| *G06F 5/06* | (2006.01) |

(52) U.S. Cl.
CPC ........ *G06F 12/1009* (2013.01); *G06F 3/0608* (2013.01); *G06F 3/0658* (2013.01); *G06F 3/0673* (2013.01); *G06F 5/06* (2013.01); *H03M 7/46* (2013.01)

(58) Field of Classification Search
None
See application file for complete search history.

(56) References Cited

U.S. PATENT DOCUMENTS

| | | | |
|---|---|---|---|
| 2003/0225992 A1 | 12/2003 | Venkatrao et al. | |
| 2004/0105497 A1* | 6/2004 | Takakura | H04N 19/176 375/240.23 |
| 2011/0087840 A1 | 4/2011 | Glasco et al. | |
| 2015/0023170 A1* | 1/2015 | Kakadia | H04L 41/0823 370/235 |
| 2015/0169465 A1 | 6/2015 | Slepon | |
| 2017/0177497 A1 | 6/2017 | Chun et al. | |

FOREIGN PATENT DOCUMENTS

| | | |
|---|---|---|
| KR | 20110010583 | 2/2011 |
| WO | WO-2017/112357 A1 | 6/2017 |
| WO | 2018106747 | 6/2018 |

OTHER PUBLICATIONS

"International Application Serial No. PCT US2019 059149, International Search Report dated Feb. 24, 2020", 3 pgs.
"International Application Serial No. PCT US2019 059149, Written Opinion dated Feb. 24, 2020", 6 pgs.

* cited by examiner

*Primary Examiner* — Midys Rojas
(74) *Attorney, Agent, or Firm* — Schwegman Lundberg & Woessner, P.A.

(57) ABSTRACT

Apparatus and methods are disclosed, including using a memory controller to generate an encoded physical address using a run length encoding (RLE) algorithm on a physical address to reduce a length of the encoded physical address, and storing the encoded physical address as a map entry of a logical-to-physical (L2P)) table in a cache random access memory of the memory controller.

20 Claims, 9 Drawing Sheets

| PHYSICAL ADDRESS {PBA,PG,DIE,CHN,PLN,FRM} | TOT BITS | EOL, + PBA [9.0] #BITS | EOL, + PG [11.0] #BITS | EOL, + DIE [0] #BITS | EOL, + CHN [0] #BITS | EOL, + PLN [1.0] #BITS | EOL, + FRM [2.0] #BITS | TOT BITS #BITS |
|---|---|---|---|---|---|---|---|---|
| {XC,X6,X0,X0,X0,X0} | 32 | 11 | 12 | 2 | 2 | 3 | 4 | 35 |
| {XC,X6,X0,X0,X0,X1} | 32 | 0 | 0 | 0 | 0 | 0 | 4 | 4 |
| {XC,X6,X0,X0,X0,X2} | 32 | 0 | 0 | 0 | 0 | 0 | 4 | 4 |
| {XC,X6,X0,X0,X0,X3} | 32 | 0 | 0 | 0 | 0 | 0 | 4 | 4 |
| {XC,X6,X0,X0,X1,X0} | 32 | 0 | 0 | 0 | 0 | 3 | 4 | 7 |
| {XC,X6,X0,X0,X2,X0} | 32 | 0 | 0 | 0 | 0 | 3 | 4 | 7 |
| {XC,X6,X0,X0,X3,X0} | 32 | 0 | 0 | 0 | 0 | 3 | 4 | 7 |
| {XC,X6,X0,X1,X0,X0} | 32 | 0 | 0 | 0 | 2 | 3 | 4 | 9 |
| {XC,X6,X1,X0,X0,X0} | 32 | 0 | 0 | 2 | 2 | 3 | 4 | 11 |
| {XC,X7,X0,X0,X0,X0} | 32 | 0 | 13 | 2 | 2 | 3 | 4 | 24 |
| {XC,X7,X0,X0,X0,X1} | 32 | 0 | 0 | 0 | 0 | 0 | 4 | 4 |
| {XC,X8,X0,X0,X0,X0} | 32 | 0 | 13 | 2 | 2 | 3 | 4 | 24 |
| {XC,X8,X1,X1,X3,X7} | 32 | 0 | 0 | 0 | 0 | 0 | 4 | 4 |
| TOTAL | 6144 | | | | | | | 998 |

*FIG. 4C*

MAPPING TABLE COMPRESSION USING A RUN LENGTH ENCODING ALGORITHM

BACKGROUND

Memory devices are semiconductor circuits that provide electronic storage of data for a host system (e.g., a computer or other electronic device). Memory devices may be volatile or non-volatile. Volatile memory requires power to maintain data, and includes devices such as random-access memory (RAM), static random-access memory (SRAM), dynamic random-access memory (DRAM), or synchronous dynamic random-access memory (SDRAM), among others. Non-volatile memory can retain stored data when not powered, and includes devices such as flash memory, read-only memory (ROM), electrically erasable programmable ROM (EPROM), erasable programmable ROM (EPROM), resistance variable memory, such as phase change random access memory (PCRAM), resistive random-access memory (RRAM), or magnetoresistive random access memory (MRAM), among others.

Host systems typically include a host processor, a first amount of main memory (e.g., often volatile memory, such as DRAM) to support the host processor, and one or more storage systems (e.g., often non-volatile memory, such as flash memory) that provide additional storage to retain data in addition to or separate from the main memory.

A storage system, such as a solid-state drive (SSD), can include a memory controller and one or more memory devices, including a number of dies or logical units (LUNs). In certain examples, each die can include a number of memory arrays and peripheral circuitry thereon, such as die logic or a die processor. The memory controller can include interface circuitry configured to communicate with a host device (e.g., the host processor or interface circuitry) through a communication interface (e.g., a bidirectional parallel or serial communication interface). The memory controller can receive commands or operations from the host system in association with memory operations or instructions, such as read or write operations to transfer data (e.g., user data and associated integrity data, such as error data or address data, etc.) between the memory devices and the host device, erase operations to erase data from the memory devices, perform drive management operations (e.g., data migration, garbage collection, block retirement), etc.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 4C illustrates an example of compressed entries in an L2P mapping table.

DETAILED DESCRIPTION

Figure 1:
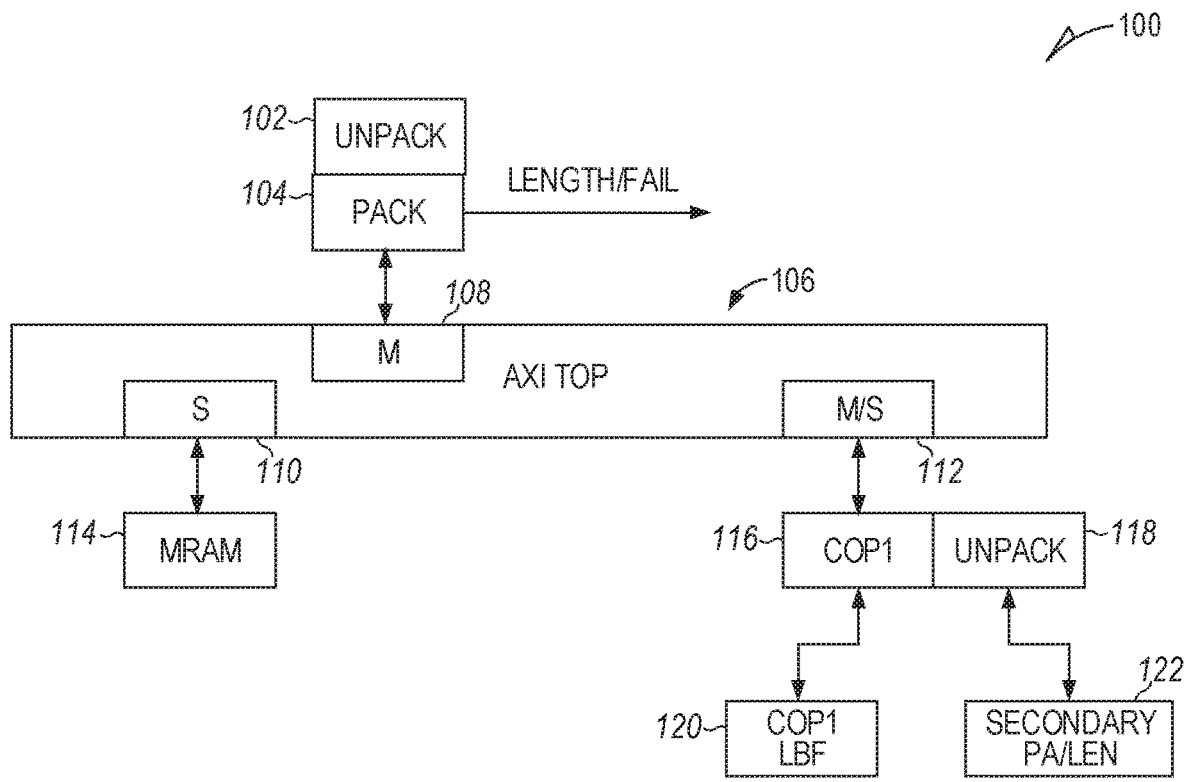
FIG. 1 illustrates an example block diagram of a flash translation layer (FTL) for logical-to-physical (L2P) mapping table compression.

Software (e.g., programs), instructions, operating systems (OS), and other data are typically stored on storage systems and accessed by main memory for use by a host processor. Main memory (e.g., RAM) is typically faster, more expensive, and a different type of memory device (e.g., volatile) than a majority of the memory devices of the storage system (e.g., non-volatile, such as an SSD, etc.). In addition to the main memory, host systems can include different levels of volatile memory, such as a group of static memory (e.g., a cache, often SRAM), often faster than the main memory, in certain examples, configured to operate at speeds close to or exceeding the speed of the host processor, but with lower density and higher cost. In other examples, more or less levels or quantities of main memory or static memory can be used, depending on desired host system performance and cost.

Flash memory devices, such as SSD, typically include one or more groups of one-transistor, floating gate memory cells. Two common types of flash memory array architectures include NAND and NOR architectures. The floating gate memory cells of the memory array are typically arranged in a matrix.

Aspects of the present disclosure are directed to a memory system with logical-to-physical (L2P) mapping table compression. A memory system can be configured to maintain a set of L2P pointers. An L2P pointer relates a physical address at a memory array of the memory system to a logical address used. L2P pointers can be stored in a common data structure as an L2P table. Read and write requests can include a logical address associated with a data unit to be read or written. The memory system uses to logical address to generate and/or access a previously-generated L2P pointer that relates to the logical address to one or more physical addresses at the memory array.

To maintain persistence, L2P pointers can be stored at the memory array of a memory system. During use of the memory system, the L2P pointers can be read directly from the memory array. If the memory system controller includes RAM, then some or all of the L2P pointers can be stored at the RAM during use to decrease latency. For example, read operations at the memory system controller RAM may be faster than read operations at the memory array. For some applications, however, the device controller RAM is too small to load a full L2P table for the memory array. Further, some memory system controllers do not include RAM.

Accordingly, in some examples, a memory system is configured to cache some or all of its L2P table including L2P pointers. The L2P pointers may be stored at a RAM. When making a read request at a logical address, the memory controller determines if it has cached a copy of the L2P pointer corresponding to that logical address. If the memory has a cached copy of the L2P pointer, it uses the L2P pointer to resolve the physical address at the memory system that corresponds to the logical address. Thus, performance of a NAND storage device is heavily influenced by L2P cache hit rate of the NAND controller.

However, cache memory has a limited amount of storage. Current mobile NAND benchmarks target a 1 GB addressing range, which uses 1 MB of embedded SRAM to hold the required number of L2P maps, using the equation:

1024 KB/4B*4 KB=1 GB (with 4B map entry)

Based on this formula, there are two ways to expand address range: increasing the mapped data size or decreasing the map entry size. Increasing the mapped data size increases the number of read-modify-write operations which tends to degrade write performance. Decreasing the map entry size can cause increased read latencies as the map entry is unpacked to complete a physical address (PA).

The present subject matter proposes to increase the L2P cache hit rate by decreasing the average physical address (PA) map entry size and limiting increased read latency using a run length encode (RLE) algorithm. By reducing the PA map entry size, additional map entries will fit in the cache, increasing the cache hit rate.

In one example, the present subject matter provides a method to decrease the average map entry size while limiting the increased read latency to less than a 1 micro-second on average. To decrease the average map entry size, a custom Run Length Encode (RLE) algorithm is used which is loosely based on a Value Change Dump (VCD) file, in various examples.

The Run Length Encoding algorithm deceases the average map entry size and therefore map page size by removing any reserved or static bits, recording only what changes from one logical block address (LBA) to the next sequential LBA, and packing the resulting bits into the SRAM, in various examples. Current mobile devices use a 32-bit map entry regardless of capacity, such that some bits in the Page Table Entry (PTE) are often static. In one example, the parts of a Physical Address and Encoded Physical Address are:

Physical Address (29 bits) Physical Block Address [9:0]
Page [11:0]
Die [0]
Channel [0]
Plane [1:0]
Frame [2:0]

Encoded Physical Address (35 bits)
Physical Block Address->{EOL, [9:0]}
Page->{EOL, [9:0]}
Die->{EOL, [0]}
Channel->{EOL, [0]}
Plane->{EOL, [1:0]}
Frame->{EOL, [2:0]}

In various examples, the End of Line (EOL) field is used to indicate where new data has stopped. For example, if a Channel is 2110, then Frame, Plane, Channel are new and the Physical Block Address, Page and Die are repeated. FIG. 4C is a table documents illustrating packed Physical Addresses for sequential map entries into a new packed map page. The illustrated example packs three NAND pages across 2 channels with 2 die on each channel. There are many gaps in the table to minimize the table size, but the final bit count is provided to demonstrate the level of compression of map entries. In the depicted example, at the end of the packing process 6144 bits are compressed into 998 bits which is a reduction of ~83% from the original map size.

FIG. 1 illustrates an example block diagram of a flash translation layer (FTL) 100 for logical-to-physical (L2P) mapping table compression. In various examples, there are hardware and FTL changes required to implement the present system with Run Length Encoded L2P pages. In certain examples, to maintain the same FTL 106 at the system level, all maps are stored to NAND in an unpacked format. When a map page is fetched from NAND, it is corrected and passed to a packer 104 to attempt to pack the map into a smaller format. If the packing process is successful, the packed FTL map is added to RAM 114 using Advanced eXtensible Interface (AXI) ports 108 and 110, and a new length of table entry is passed to the Map Automation logic. If the packing process fails, then an unpacked map is used in its original format. When a dirty map page is stored to NAND it must first be unpacked 102 before being written to NAND, in various examples. Once the map is loaded from RAM 114 into the FTL, the map automation requires new logic 118 to handle packed map formats and random map to map boundaries. To find the address and length of a map page (L2P) a new RAM 122 is added to hold the unique address and length of each map page stored in RAM 114. Map hardware assist logic 112, 116 and 120 is used to fetch a physical address using a LBA reference, in various examples.

Figure 2:
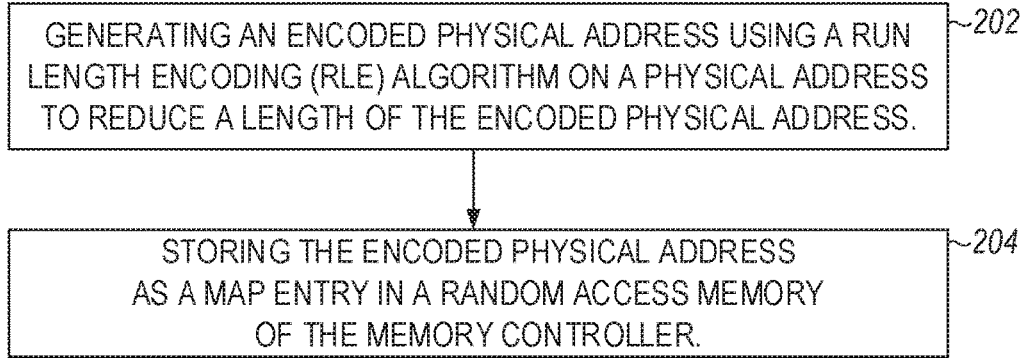
FIG. 2 illustrates an example method of compressing an L2P mapping table entry.

FIG. 2 illustrates an example method of compressing an L2P mapping table entry. In various examples, the method 200 includes generating, by a memory controller, an encoded physical address using a run length encoding (RLE) algorithm on a physical address to reduce a length of the encoded physical address, at 202. At 204, the method further includes storing, by the memory controller, the encoded physical address as a map entry in a random access memory.

Figure 3:
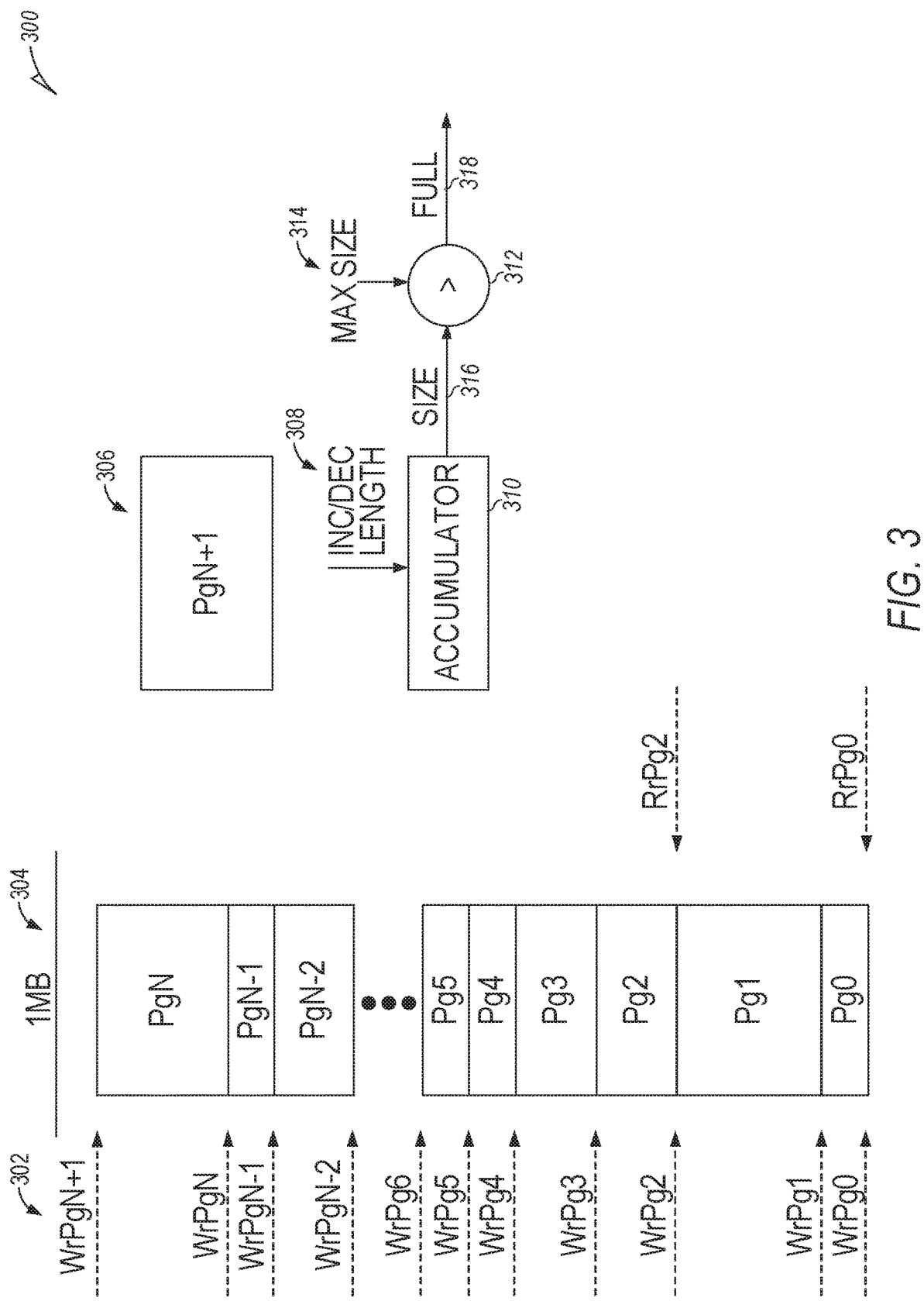
FIG. 3 illustrates an example flow diagram of first-in first-out (FIFO) FTL processing for L2P mapping table compression.

FIG. 3 illustrates an example flow diagram of first-in first-out (FIFO) FTL processing for L2P mapping table compression. In various examples, to improve the process of adding and deleting map pages, the L2P operates like a FIFO. When a new map page 302, 306 is loaded, one or more old map pages 304 are deleted and the space is reclaimed. By using a FIFO structure, the L2P is always fully packed into the embedded SRAM for maximum efficiency.

In various examples, maps loaded for reads are compressed and read by the map automation, using logic 308, 310, 312, 314, 316, 318, to obtain the PA for the target LBA. The map automation performs a local unpacking while discarding intermediate results. To expedite the random unpacking, full Physical Addresses are loaded into the packed page every 256 LBA's, in one example. In various examples, maps loaded for writes are not compressed, to make read/modify/write updates more efficient. In the case where a packed map is already in the FIFO and a write occurs, the current location is updated with a null pointer and the unpacked map page is reloaded at the start of the FIFO. Eventually, as new map pages are added, the page with a null pointer will fall out of the FTL. In one example, a L2P page with a length of 4096B is not compressed and reverts to a non-pack format.

Figure 4A:
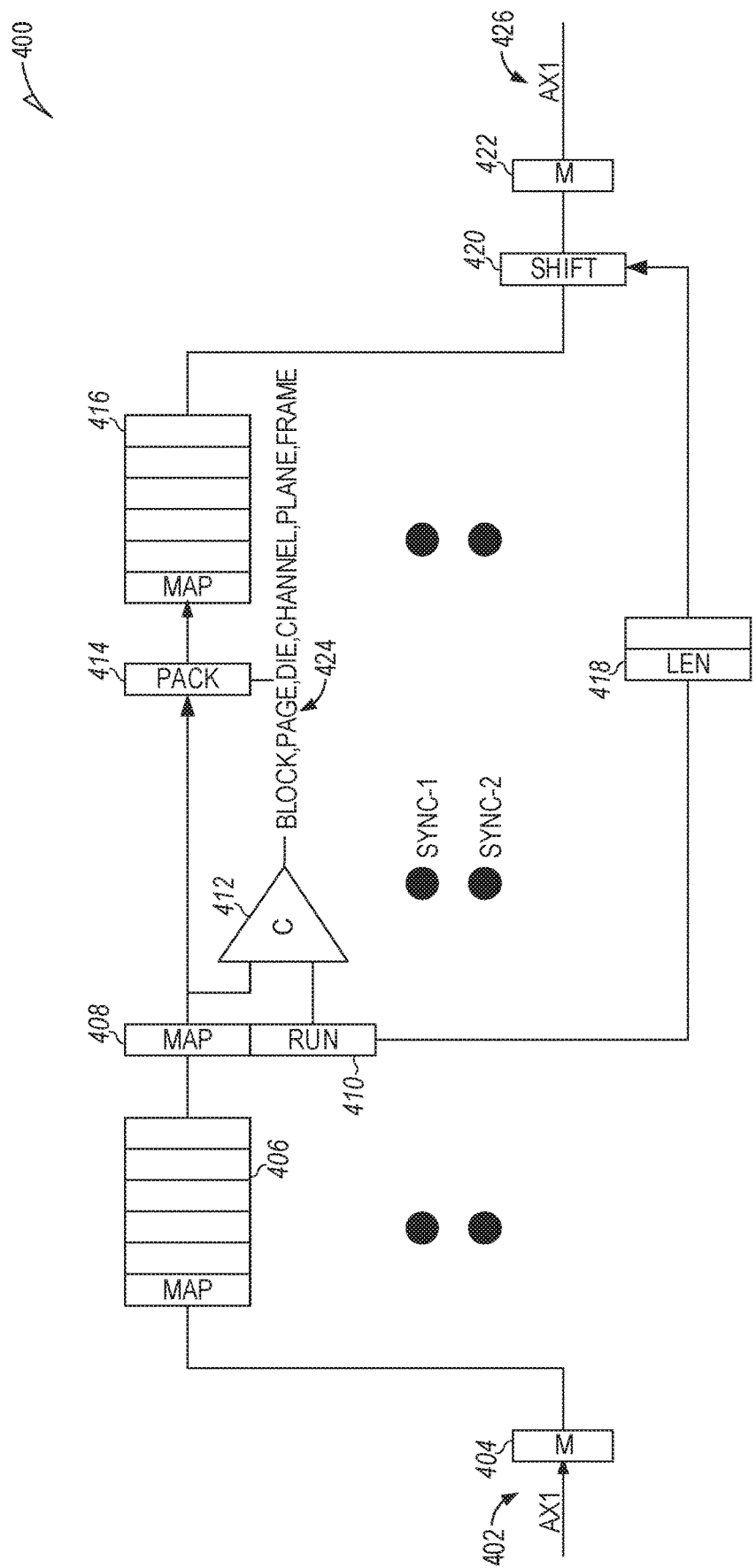
FIGS. 4A-4B illustrate example methods of packing and unpacking L2P mapping table entries.
Figure 4B:
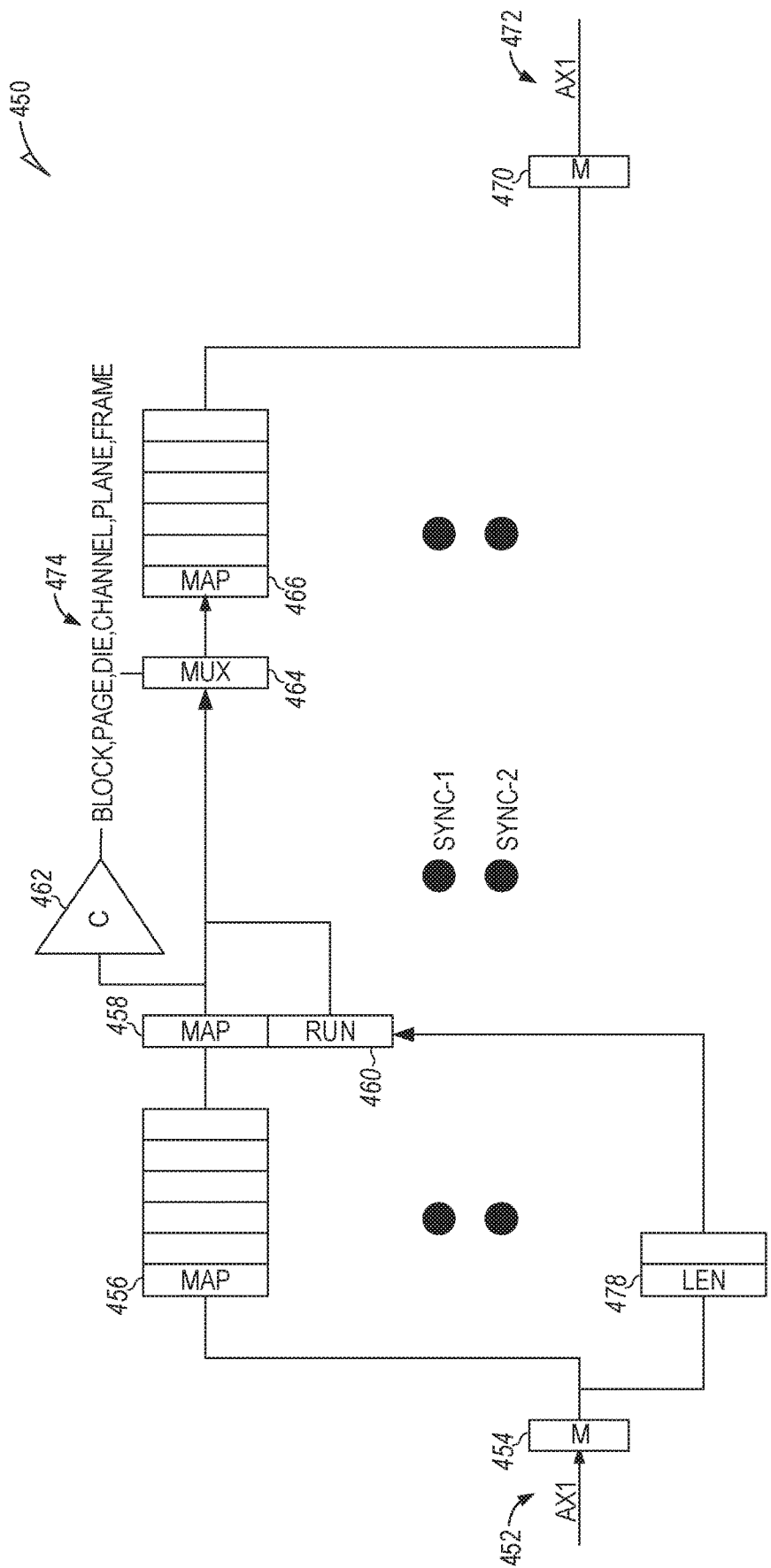

FIGS. 4A-4B illustrate example methods of packing and unpacking L2P mapping table entries. FIG. 4A illustrates an example method 400 of packing L2P mapping table entries. To start a packing operation based on an input 402 to AXI port 404, a L2P page 406 is read into the packer and the first entry 408 is captured to set the comparisons 412 up for the next page entry. A block, page, die, channel, plane and frame of the address is output from the comparison at 424. Redundant information with "running" baseline 410 is deleted, in one example. When encoding 414, 416, 418, 420 is complete a final length and sync offsets are passed to map automation logic 116 and 118 using AXI ports 108 and 112, where elements 404, 422, 454 and 470 are associated AXI ports in FIGS. 4A-4B. An output 426 from AXI port 422 includes map offsets.

FIG. 4B illustrates an example method 450 of unpacking L2P mapping table entries. To start an unpacking operation based on an input 452 to AXI port 454, a packed L2P page 456 is read into the unpacker and the first entry 458 is captured to set the baseline for comparisons 462 with the next page entry. A block, page, die, channel, plane and frame of the address is output from the comparison at 474. Missing information is sourced from the "running" baseline register 460. In various examples, to expedite the packing and unpacking, "Sync" entries can be used to enable parallel encoding and decoding 464, 466, 478. For example, to increase encoding and decoding performance of a 1 KB of a L2P page sync, entries are created at LBA {0,256,512, 768}. The 4 sync's ensure that 4 hardware threads can process the L2P page in parallel and speed up operation by 4×. An output 472 from AXI port 470 includes map offsets.

Figure 5:
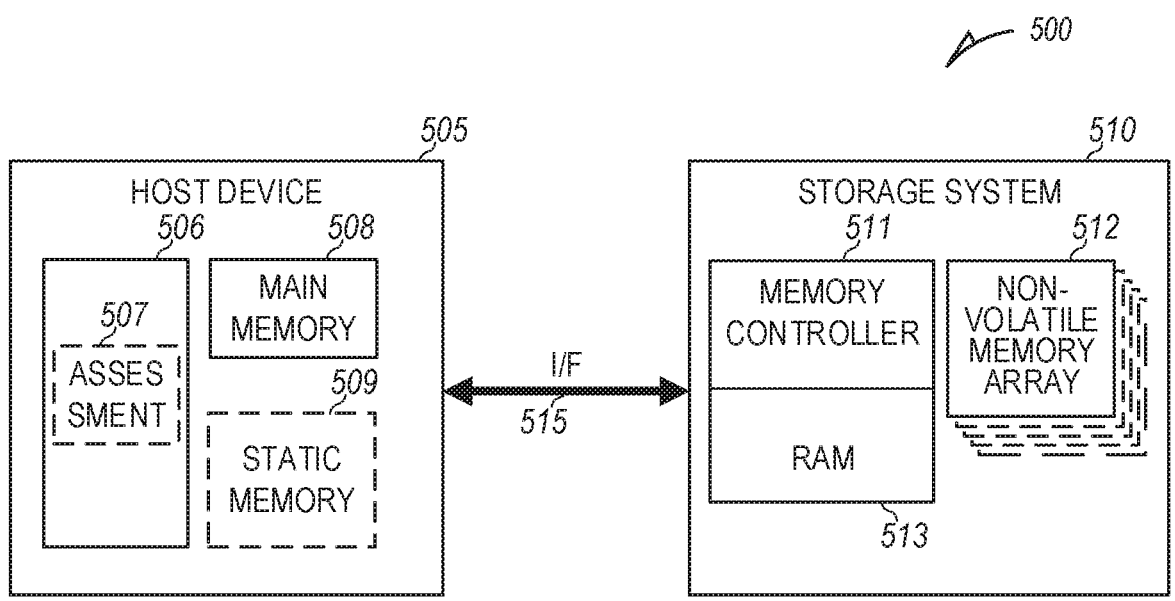
FIG. 5 illustrates an example host system including a host device and a storage system.

FIG. 5 illustrates an example system (e.g., a host system) 500 including a host device 505 and a storage system 510 configured to communicate over a communication interface (I/F) 515 (e.g., a bidirectional parallel or serial communication interface). The host device 505 can include a host processor 506 (e.g., a host central processing unit (CPU) or other processor or processing device) or other host circuitry (e.g., a memory management unit (MMU), interface circuitry, assessment circuitry 507, etc.). In certain examples, the host device 505 can include a main memory 508 (e.g., DRAM, etc.) and optionally, a static memory 109, to support operation of the host processor 506.

The storage system 510 can include a universal flash storage (UFS) device, an embedded MMC (eMMC™) device, or one or more other memory devices. For example, if the storage system 510 includes a UFS device, the communication interface 515 can include a serial bidirectional interface, such as defined in one or more Joint Electron Device Engineering Council (JEDEC) standards (e.g., JEDEC standard D223D (JESD223D), commonly referred to as JEDEC UFS Host Controller Interface (UFSHCI) 3.0, etc.). In another example, if the storage system 510 includes an eMMC device, the communication interface 515 can include a number of parallel bidirectional data lines (e.g., DAT[7:0]) and one or more command lines, such as defined in one or more JEDEC standards (e.g., JEDEC standard D84-851 (JESD84-A51), commonly referred to as JEDEC eMMC standard 5.1, etc.). In other examples, the storage system 510 can include one or more other memory devices, or the communication interface 515 can include one or more other interfaces, depending on the host device 505 and the storage system 510.

The storage system 510 can include a memory controller 511, a random access memory (or cache) 513 and a non-volatile memory 512. In an example, the non-volatile memory can include a number of memory devices (e.g., dies or LUNs), such as one or more flash memory devices, etc., each including periphery circuitry thereon, and controlled by the memory controller 511.

Flash memory devices typically include one or more groups of one-transistor, floating gate memory cells. Two common types of flash memory array architectures include NAND and NOR architectures. The floating gate memory cells of the memory array are typically arranged in a matrix. The gates of each memory cell in a row of the array are coupled to an access line (e.g., a word line). In NOR architecture, the drains of each memory cell in a column of the array are coupled to a data line (e.g., a bit line). In NAND architecture, the drains of each memory cell in a column of the array are coupled together in series, source to drain, between a source line and a bit line.

Each memory cell in a NOR, NAND, 3D Cross Poitn (Xpoint), Holographic RAM (HRAM), MRAM, or one or more other architecture semiconductor memory array can be programmed individually or collectively to one or a number of programmed states. A single-level cell (SLC) can represent one bit of data per cell in one of two programmed states (e.g., 1 or 0). A multi-level cell (MLC) can represent two or more bits of data per cell in a number of programmed states (e.g., $2^n$, where n is the number of bits of data). In certain examples, MLC can refer to a memory cell that can store two bits of data in one of 4 programmed states. A triple-level cell (TLC) can represent three bits of data per cell in one of 8 programmed states. A quad-level cell (QLC) can represent four bits of data per cell in one of 16 programmed states. In other examples, MLC can refer to any memory cell that can store more than one bit of data per cell, including TLC and QLC, etc.

The storage system 510 can include a multimedia card (MMC) solid-state storage device (e.g., micro secure digital (SD) cards, etc.). MMC devices include a number of parallel interfaces (e.g., an 8-bit parallel interface) with a host device 505, and are often removable and separate components from the host device. In contrast, embedded MMC (eMMC) devices are attached to a circuit board and considered a component of the host device, with read speeds that rival serial ATA (SATA) based SSD devices. As demand for mobile device performance continues to increase, such as to fully enable virtual or augmented-reality devices, utilize increasing networks speeds, etc., storage systems have shifted from parallel to serial communication interfaces. UFS devices, including controllers and firmware, communicate with a host device using a low-voltage differential signaling (LVDS) serial interface with dedicated read/write paths, further advancing read/write speeds between a host device and a storage system.

In three-dimensional (3D) architecture semiconductor memory device technology, vertical floating gate or charge trapping storage structures can be stacked, increasing the number of tiers, physical pages, and accordingly, the density of memory cells in a memory device.

Data is often stored arbitrarily on the storage system as small units. Even if accessed as a single unit, data can be received in small, random 4-16k single file reads (e.g., 60%-80% of operations are smaller than 16k). It is difficult for a user and even kernel applications to indicate that data should be stored as one sequential cohesive unit. File systems are typically designed to optimize space usage, and not sequential retrieval space.

The memory controller 511 can receive instructions from the host device 505, and can communicate with the non-volatile memory 512, such as to transfer data to (e.g., write or erase) or from (e.g., read) one or more of the memory cells of the non-volatile memory array 512. The memory controller 511 can include, among other things, circuitry or firmware, such as a number of components or integrated circuits. For example, the memory controller 511 can include one or more memory control units, circuits, or components configured to control access across the memory array and to provide a translation layer between the host device 505 and the storage system 500.

The non-volatile memory array 512 (e.g., a 3D NAND architecture semiconductor memory array) can include a number of memory cells arranged in, for example, a number of devices, planes, blocks, or physical pages. As one example, a TLC memory device can include 18,592 bytes (B) of data per page, 1536 pages per block, 548 blocks per plane, and 4 planes per device. As another example, an MLC memory device can include 18,592 bytes (B) of data per page, 1024 pages per block, 548 blocks per plane, and 4 planes per device, but with half the required write time and twice the program/erase (P/E) cycles as a corresponding TLC memory device. Other examples can include other numbers or arrangements.

Various examples include a system including a host device including a host device memory and a host device processor, and a memory device or storage system. The memory device or storage system includes a memory array, a random access memory, and a memory controller. The memory controller is programmed to perform operations including: generating an encoded physical address using a run length encoding (RLE) algorithm on a physical address of the memory array to reduce a length of the encoded physical address; and storing the encoded physical address as a map entry in the random access memory.

Figure 6:
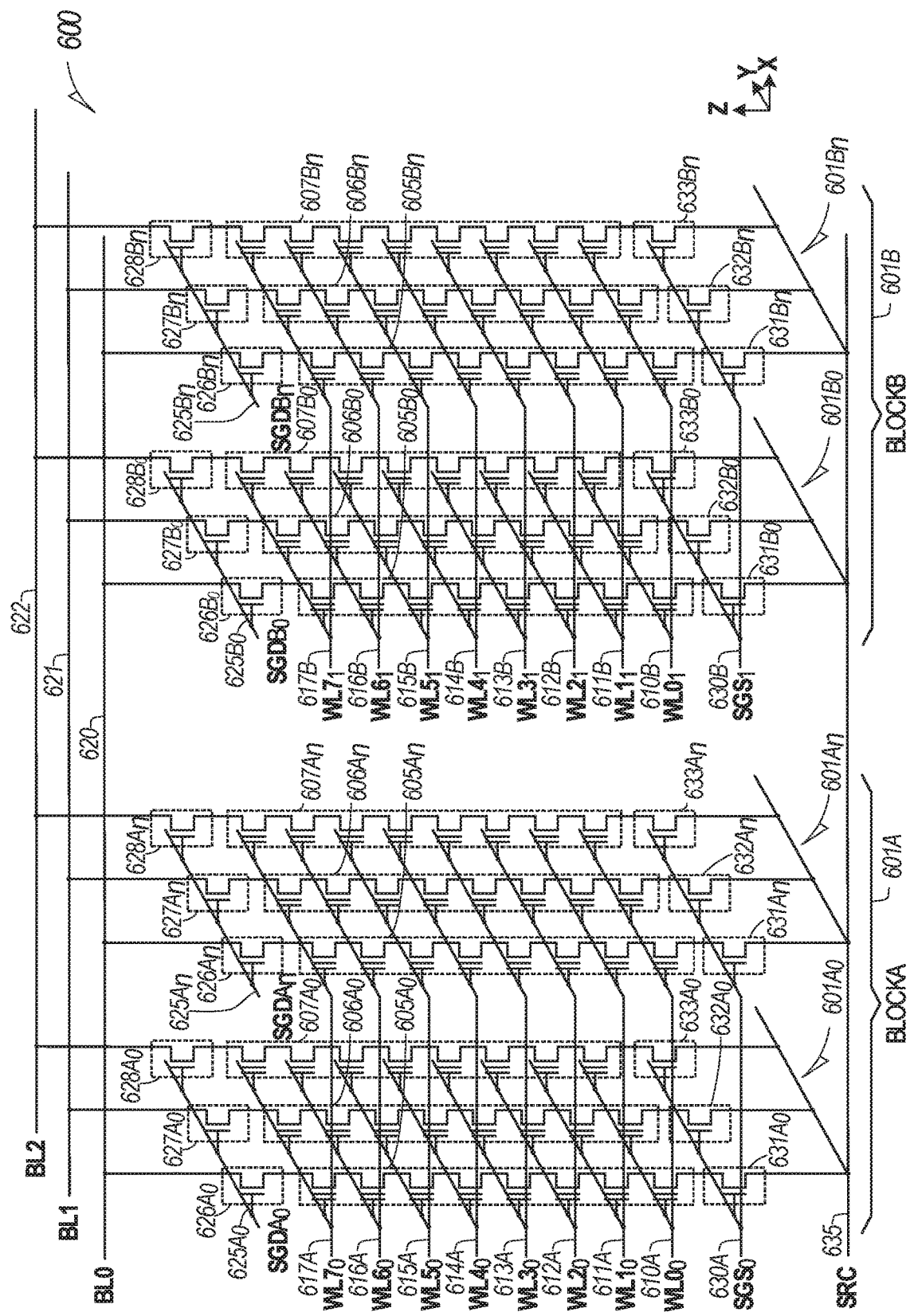
FIG. 6 illustrates an example schematic diagram of a 3D NAND architecture semiconductor memory array.

FIG. 6 illustrates an example schematic diagram of a 3D NAND architecture semiconductor memory array 600 including a number of strings of memory cells (e.g., first-third $A_0$ memory strings $605A_0$-$607A_0$, first-third $A_n$, memory strings $605A_n$-$607A_n$, first-third $B_0$ memory strings $605B_0$-$607B_0$, first-third $B_n$, memory strings $605B_n$-$607B_n$, etc.), organized in blocks (e.g., block A 601A, block B 601B, etc.) and sub-blocks (e.g., sub-block $A_0$ $601A_0$, sub-block $A_n$, $601A_n$, sub-block $B_0$ $601B_0$, sub-block $B_n$, $601B_n$, etc.). The memory array 600 represents a portion of a greater number of similar structures that would typically be found in a block, device, or other unit of a memory device.

Each string of memory cells includes a number of tiers of charge storage transistors (e.g., floating gate transistors, charge-trapping structures, etc.) stacked in the Z direction, source to drain, between a source line (SRC) 635 or a source-side select gate (SGS) (e.g., first-third $A_0$ SGS $631A_0$-$633A_0$, first-third $A_n$, SGS $631A_n$-$633A_n$, first-third $B_0$ SGS $631B_0$-$633B_0$, first-third $B_n$, SGS $631B_n$-$633B_n$, etc.) and a drain-side select gate (SGD) (e.g., first-third $A_0$ SGD $626A_0$-$628A_0$, first-third A, SGD $626A_n$-$628A$, first-third $B_0$ SGD $626B_0$-$628B_0$, first-third $B_n$ SGD $626B_n$-$628B_n$, etc.). Each string of memory cells in the 3D memory array can be arranged along the X direction as data lines (e.g., bit lines (BL) BL0-BL6 620-622), and along the Y direction as physical pages.

Within a physical page, each tier represents a row of memory cells, and each string of memory cells represents a column. A sub-block can include one or more physical pages. A block can include a number of sub-blocks (or physical pages) (e.g., 128, 256, 384, etc.). Although illustrated herein as having two blocks, each block having two sub-blocks, each sub-block having a single physical page, each physical page having three strings of memory cells, and each string having 8 tiers of memory cells, in other examples, the memory array 600 can include more or fewer blocks, sub-blocks, physical pages, strings of memory cells, memory cells, or tiers. For example, each string of memory cells can include more or fewer tiers (e.g., 16, 32, 64, 128, etc.), as well as one or more additional tiers of semiconductor material above or below the charge storage transistors (e.g., select gates, data lines, etc.), as desired. As an example, a 48 GB TLC NAND memory device can include 18,592 bytes (B) of data per page (16,384+2208 bytes), 1536 pages per block, 548 blocks per plane, and 4 or more planes per device.

Each memory cell in the memory array 600 includes a control gate (CG) coupled to (e.g., electrically or otherwise operatively connected to) an access line (e.g., word lines (WL) $WL0_0$-$WL7_0$ 610A-617A, $WL0_1$-$WL7_1$ 610B-617B, etc.), which collectively couples the control gates (CGs) across a specific tier, or a portion of a tier, as desired. Specific tiers in the 3D memory array, and accordingly, specific memory cells in a string, can be accessed or controlled using respective access lines. Groups of select gates can be accessed using various select lines. For example, first-third $A_0$ SGD $626A_0$-$628A_0$ can be accessed using an $A_0$ SGD line $SGDA_0$ $625A_0$, first-third $A_n$, SGD $626A_n$-$628A_n$ can be accessed using an SGD line $SGDA_n$ $625A_n$, first-third $B_0$ SGD $626B_0$-$628B_0$ can be accessed using an $B_0$ SGD line $SGDB_0$ $625B_0$, and first-third $B_n$ SGD $626B_n$-$628B_n$ can be accessed using an $B_n$ SGD line $SGDB_n$ $625B_n$. First-third $A_0$ SGS $631A_0$-$633A_0$ and first-third $A_n$ SGS $631A_n$-$633A_n$ can be accessed using a gate select line $SGS_0$ 630A, and first-third $B_0$ SGS $631B_0$-$633B_0$ and first-third $B_n$ SGS $631B_n$-$633B_n$ can be accessed using a gate select line $SGS_1$ 630B.

In an example, the memory array 600 can include a number of levels of semiconductor material (e.g., polysilicon, etc.) configured to couple the control gates (CGs) of each memory cell or select gate (or a portion of the CGs or select gates) of a respective tier of the array. Specific strings of memory cells in the array can be accessed, selected, or controlled using a combination of bit lines (BLs) and select gates, etc., and specific memory cells at one or more tiers in the specific strings can be accessed, selected, or controlled using one or more access lines (e.g., word lines).

In a NAND architecture semiconductor memory array, the state of a selected memory cell can be accessed by sensing a current or voltage variation associated with a particular data line containing the selected memory cell. The memory array 600 can be accessed (e.g., by a control circuit, one or more processors, digital logic, etc.) using one or more drivers. In an example, one or more drivers can activate a specific memory cell, or set of memory cells, by driving a particular potential to one or more data lines (e.g., bit lines BL0-BL2), access lines (e.g., word lines WL0-WL7), or select gates, depending on the type of operation desired to be performed on the specific memory cell or set of memory cells.

To program or write data to a memory cell, a programming voltage (Vpgm) one or more programming pulses, etc.) can be applied to selected word lines (e.g., $WL4_0$), and thus, to a control gate of each memory cell coupled to the selected word lines. Programming pulses can begin, for example, at or near 15V, and, in certain examples, can increase in magnitude during each programming pulse application. While the program voltage is applied to the selected word lines, a potential, such as a ground potential (e.g., Vss), can be applied to the data lines (e.g., bit lines) and substrates (and thus the channels, between the sources and drains) of the memory cells targeted for programming, resulting in a charge transfer (e.g., direct injection or Fowler-Nordheim (FN) tunneling, etc.) from the channels to the floating gates of the targeted memory cells.

In contrast, a pass voltage (Vpass) can be applied to one or more word lines having memory cells that are not targeted for programming, or an inhibit voltage (e.g., Vcc) can be applied to data lines (e.g., bit lines) having memory cells that are not targeted for programming, for example, to inhibit charge from being transferred from the channels to the floating gates of such non-targeted memory cells. The pass voltage can be variable, depending, for example, on the proximity of the applied pass voltages to a word line targeted for programming. The inhibit voltage can include a supply voltage (Vcc), such as a voltage from an external source or supply (e.g., a battery, an AC-to-DC converter, etc.), relative to a ground potential (e.g., Vss).

As an example, if a programming voltage (e.g., 15V or more) is applied to a specific word line, such as $WL4_0$, a pass voltage of 10V can be applied to one or more other word lines, such as $WL3_0$, $WL5_0$, etc., to inhibit programming of non-targeted memory cells, or to retain the values stored on such memory cells not targeted for programming. As the distance between an applied program voltage and the non-targeted memory cells increases, the pass voltage required to refrain from programming the non-targeted memory cells can decrease. For example, where a programming voltage of 15V is applied to $WL4_0$, a pass voltage of 10V can be applied to $WL3_0$ and $WL5_0$, a pass voltage of 8V can be applied to $WL2_0$ and $WL6_0$, a pass voltage of 7V can be applied to $WL1_0$ and $WL7_0$, etc. In other examples, the pass voltages, or number of word lines, etc., can be higher or lower, or more or less.

Sense amplifiers can be coupled to one or more of the data lines (e.g., first, second, or third bit lines (BL0-BL2) 620-622), can detect the state of each memory cell in respective data lines by sensing a voltage or current on a particular data line.

Between applications of one or more programming pulses (e.g., Vpgm), a verify operation can be performed to determine if a selected memory cell has reached its intended programmed state. If the selected memory cell has reached its intended programmed state, it can be inhibited from further programming. If the selected memory cell has not reached its intended programmed state, additional programming pulses can be applied. If the selected memory cell has not reached its intended programmed state after a particular number of programming pulses (e.g., a maximum number), the selected memory cell, or a string, block, or page associated with such selected memory cell, can be marked as defective.

To erase a memory cell or a group of memory cells (e.g., erasure is typically performed in blocks or sub-blocks), an erasure voltage (Vers) (e.g., typically Vpgm) can be applied to the substrates (and thus the channels, between the sources and drains) of the memory cells targeted for erasure (e.g., using one or more bit lines, select gates, etc.), while the word lines of the targeted memory cells are kept at a potential, such as a ground potential (e.g., Vss), resulting in a charge transfer (e.g., direct injection or Fowler-Nordheim (FN) tunneling, etc.) from the floating gates of the targeted memory cells to the channels.

Figure 7:
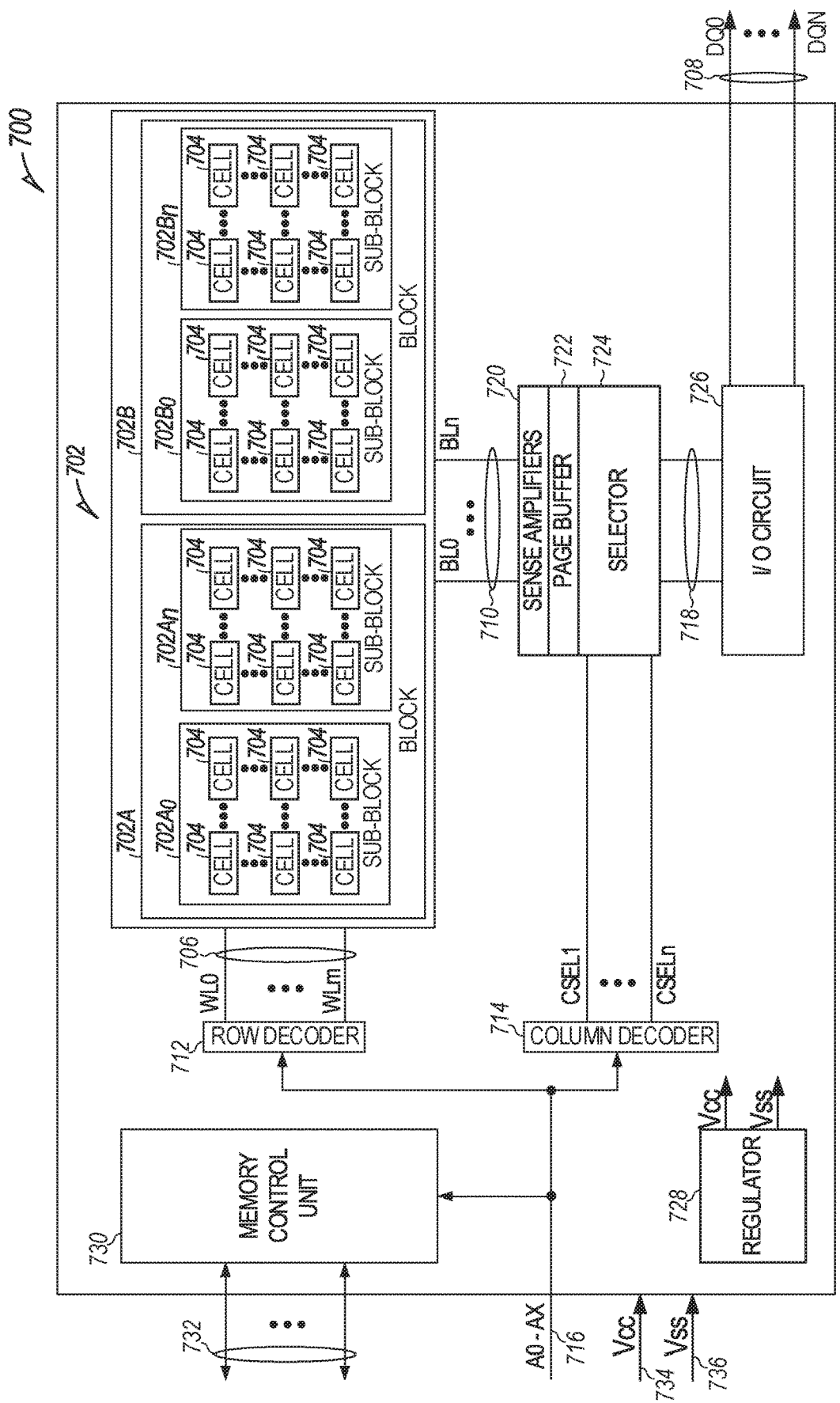
FIG. 7 illustrates an example block diagram of a memory module.

FIG. 7 illustrates an example block diagram of a memory device 700 including a memory array 702 having a plurality of memory cells 704, and one or more circuits or components to provide communication with, or perform one or more memory operations on, the memory array 702. Although shown with a single memory array 702, in other examples, one or more additional memory arrays, dies, or LUNs can be included herein. In certain examples, in a storage system having a number of dies or LUNs, the memory device 700 can represent a block diagram of circuits and components for each die or LUN. The memory device 700 can include a row decoder 712, a column decoder 714, sense amplifiers 720, a page buffer 722, a selector 724, an input/output (I/O) circuit 726, and a memory control unit 730.

The memory cells 704 of the memory array 702 can be arranged in blocks, such as first and second blocks 702A, 702B. Each block can include sub-blocks. For example, the first block 702A can include first and second sub-blocks $702A_0$, $702A_n$, and the second block 702B can include first and second sub-blocks $702B_0$, $702B_n$. Each sub-block can include a number of physical pages, each page including a number of memory cells 704. Although illustrated herein as having two blocks, each block having two sub-blocks, and each sub-block having a number of memory cells 704, in other examples, the memory array 702 can include more or fewer blocks, sub-blocks, memory cells, etc. In other examples, the memory cells 704 can be arranged in a number of rows, columns, pages, sub-blocks, blocks, etc., and accessed using, for example, access lines 706, first data lines 710, or one or more select gates, source lines, etc.

The memory control unit 730 can control memory operations of the memory device 700 according to one or more signals or instructions received on control lines 732, including, for example, one or more clock signals or control signals that indicate a desired operation (e.g., write, read, erase, etc.), or address signals (A0-AX) received on one or more address lines 716. One or more devices external to the memory device 700 can control the values of the control signals on the control lines 732, or the address signals on the address line 716. Examples of devices external to the memory device 700 can include, but are not limited to, a host, a memory controller, a processor, or one or more circuits or components not illustrated in FIG. 7.

The memory device 700 can use access lines 706 and first data lines 710 to transfer data to (e.g., write or erase) or from (e.g., read) one or more of the memory cells 704. The row decoder 712 and the column decoder 714 can receive and decode the address signals (A0-AX) from the address line 716, can determine which of the memory cells 704 are to be accessed, and can provide signals to one or more of the access lines 706 (e.g., one or more of a plurality of word lines (WL0-WLm)) or the first data lines 710 (e.g., one or more of a plurality of bit lines (BL0-BLn)), such as described above.

The memory device 700 can include sense circuitry, such as the sense amplifiers 720, configured to determine the values of data on (e.g., read), or to determine the values of data to be written to, the memory cells 704 using the first data lines 710. For example, in a selected string of memory cells 704, one or more of the sense amplifiers 720 can read a logic level in the selected memory cell 704 in response to a read current flowing in the memory array 702 through the selected string to the data lines 710.

One or more devices external to the memory device 700 can communicate with the memory device 700 using the I/O lines (DQ0-DON) 708, address lines 716 (A0-AX), or control lines 732. The input/output (I/O) circuit 726 can transfer values of data in or out of the memory device 700, such as in or out of the page buffer 722 or the memory array 702, using the I/O lines 708, according to, for example, the control lines 732 and address lines 716. The page buffer 722 can store data received from the one or more devices external to the memory device 700 before the data is programmed into relevant portions of the memory array 702, or can store data read from the memory array 702 before the data is transmitted to the one or more devices external to the memory device 700.

The column decoder 714 can receive and decode address signals (A0-AX) into one or more column select signals (CSEL1-CSELn). The selector 724 (e.g., a select circuit) can receive the column select signals (CSEL1-CSELn) and select data in the page buffer 722 representing values of data to be read from or to be programmed into memory cells 704. Selected data can be transferred between the page buffer 722 and the I/O circuit 726 using second data lines 718.

The memory control unit 730 can receive positive and negative supply signals, such as a supply voltage (Vcc) 734 and a negative supply (Vss) 736 (e.g., a ground potential), from an external source or supply (e.g., an internal or external battery, an AC-to-DC converter, etc.). In certain examples, the memory control unit 730 can include a regulator 728 to internally provide positive or negative supply signals.

Figure 8:
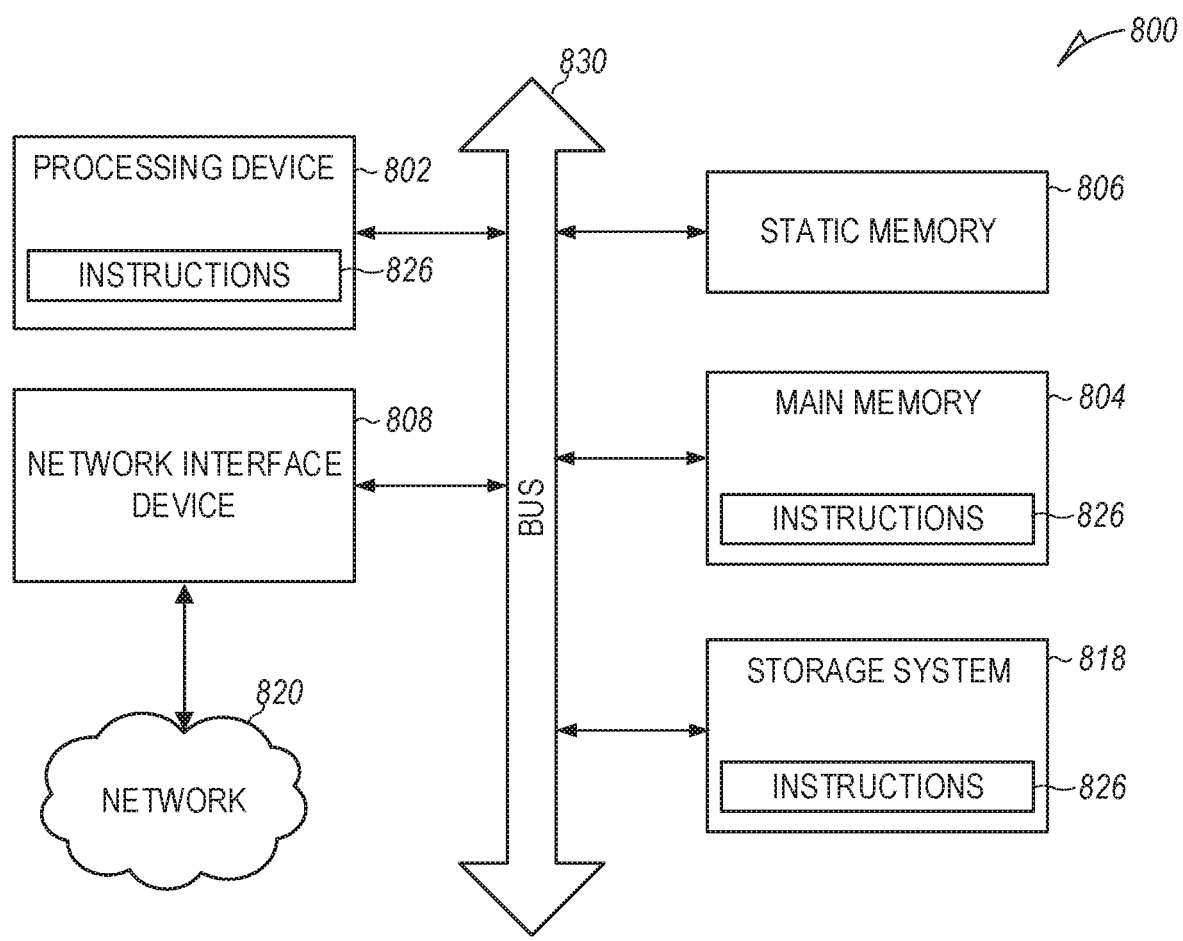
FIG. 8 illustrates an example block diagram of an information handling system.

FIG. 8 illustrates a block diagram of an example machine (e.g., a host system) 800 upon which any one or more of the techniques (e.g., methodologies) discussed herein may perform. In alternative embodiments, the machine 800 may operate as a standalone device or may be connected (e.g., networked) to other machines. In a networked deployment, the machine 800 may operate in the capacity of a server machine, a client machine, or both in server-client network environments. In an example, the machine 800 may act as a peer machine in peer-to-peer (P2P) (or other distributed) network environment. The machine 800 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

The machine (e.g., computer system, a host system, etc.) 800 may include a processing device 802 (e.g., a hardware processor, a central processing unit (CPU), a graphics processing unit (GPU), a hardware processor core, or any combination thereof, etc.), a main memory 804 (e.g., read-only memory (ROM), dynamic random-access memory (DRAM) such as synchronous DRAM (SDRAM) or Rambus DRAM (RDRAM), etc.), a static memory 806 (e.g., static random-access memory (SRAM), etc.), and a storage system 818, some or all of which may communicate with each other via a communication interface (e.g., a bus) 830.

The processing device 802 can represent one or more general-purpose processing devices such as a microprocessor, a central processing unit, or the like. More particularly, the processing device can be a complex instruction set computing (DSC) microprocessor, reduced instruction set computing (RISC) microprocessor, very long instruction word (VLIW) microprocessor, or a processor implementing other instruction sets, or processors implementing a combination of instruction sets. The processing device 802 can also be one or more special-purpose processing devices such as an application specific integrated circuit (ASIC), a field programmable gate array (FPGA), a digital signal processor (DSP), network processor, or the like. The processing device 802 can be configured to execute instructions 826 for performing the operations and steps discussed herein. The computer system 800 can further include a network interface device 808 to communicate over a network 820.

The storage system 818 can include a machine-readable storage medium (also known as a computer-readable medium) on which is stored one or more sets of instructions 826 or software embodying any one or more of the methodologies or functions described herein. The instructions 826 can also reside, completely or at least partially, within the main memory 804 or within the processing device 802 during execution thereof by the computer system 800, the main memory 804 and the processing device 802 also constituting machine-readable storage media.

The term "machine-readable storage medium" should be taken to include a single medium or multiple media that store the one or more sets of instructions, or any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media. In an example, a massed machine-readable medium comprises a machine-readable medium with a plurality of particles having invariant (e.g., rest) mass. Accordingly, massed machine-readable media are not transitory propagating signals. Specific examples of massed machine-readable media may include: non-volatile memory, such as semiconductor memory devices (e.g., Electrically Programmable Read-Only Memory (EPROM), Electrically Erasable Programmable Read-Only Memory (EPROM)) and flash memory devices; magnetic disks, such as internal hard disks and removable disks; magneto-optical disks; and CD-ROM and DVD-ROM disks.

The machine 800 may further include a display unit, an alphanumeric input device (e.g., a keyboard), and a user interface (UI) navigation device (e.g., a mouse). In an example, one or more of the display unit, the input device, or the UI navigation device may be a touch screen display. The machine a signal generation device (e.g., a speaker), or one or more sensors, such as a global positioning system (GPS) sensor, compass, accelerometer, or one or more other sensor. The machine 800 may include an output controller, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The instructions 826 (e.g., software, programs, an operating system (OS), etc.) or other data are stored on the storage system 818 can be accessed by the main memory 804 for use by the processing device 802. The main memory 804 (e.g., DRAM) is typically fast, but volatile, and thus a different type of storage than the storage system 818 (e.g., an SSD), which is suitable for long-term storage, including while in an "off" condition. The instructions 826 or data in use by a user or the machine 800 are typically loaded in the main memory 804 for use by the processing device 802. When the main memory 804 is full, virtual space from the storage system 818 can be allocated to supplement the main memory 804; however, because the storage system 818 device is typically slower than the main memory 804, and write speeds are typically at least twice as slow as read speeds, use of virtual memory can greatly reduce user experience due to storage system latency (in contrast to the main memory 804, e.g., DRAM). Further, use of the storage system 818 for virtual memory can greatly reduce the usable lifespan of the storage system 818.

The instructions 824 may further be transmitted or received over a network 820 using a transmission medium via the network interface device 808 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 808 may include one or more physical jacks (e.g., Ethernet, coaxial, or phone jacks) or one or more antennas to connect to the network 820. In an example, the network interface device 808 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding, or carrying instructions for execution by the machine 800, and includes digital or analog communications signals or other intangible medium to facilitate communication of such software.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventor also contemplates examples in which only those elements shown or described are provided. Moreover, the present inventor also contemplates examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

The term "horizontal" as used in this document is defined as a plane parallel to the conventional plane or surface of a substrate, such as that underlying a wafer or die, regardless of the actual orientation of the substrate at any point in time. The term "vertical" refers to a direction perpendicular to the horizontal as defined above. Prepositions, such as "on," "over," and "under" are defined with respect to the conventional plane or surface being on the top or exposed surface of the substrate, regardless of the orientation of the substrate; and while "on" is intended to suggest a direct contact of one structure relative to another structure which it lies "on"(in the absence of an express indication to the contrary); the terms "over" and "under" are expressly intended to identify a relative placement of structures (or layers, features, etc.), which expressly includes—but is not limited to—direct contact between the identified structures unless specifically identified as such. Similarly, the terms "over" and "under" are not limited to horizontal orientations, as a structure may be "over" a referenced structure if it is, at some point in time, an outermost portion of the construction under discussion, even if such structure extends vertically relative to the referenced structure, rather than in a horizontal orientation.

The terms "wafer" and "substrate" are used herein to refer generally to any structure on which integrated circuits are formed, and also to such structures during various stages of integrated circuit fabrication. The following detailed description is, therefore, not to be taken in a limiting sense, and the scope of the various embodiments is defined only by the appended claims, along with the full scope of equivalents to which such claims are entitled.

Various embodiments according to the present disclosure and described herein include memory utilizing a vertical structure of memory cells (e.g., NAND strings of memory cells). As used herein, directional adjectives will be taken relative a surface of a substrate upon which the memory cells are formed (i.e., a vertical structure will be taken as extending away from the substrate surface, a bottom end of the vertical structure will be taken as the end nearest the substrate surface and a top end of the vertical structure will be taken as the end farthest from the substrate surface).

As used herein, directional adjectives, such as horizontal, vertical, normal, parallel, perpendicular, etc., can refer to relative orientations, and are not intended to require strict adherence to specific geometric properties, unless otherwise noted. For example, as used herein, a vertical structure need not be strictly perpendicular to a surface of a substrate, but may instead be generally perpendicular to the surface of the substrate, and may form an acute angle with the surface of the substrate (e.g., between 60 and 120 degrees, etc.).

In some embodiments described herein, different doping configurations may be applied to a select gate source (SGS), a control gate (CG), and a select gate drain (SGD), each of which, in this example, may be formed of or at least include polysilicon, with the result such that these tiers (e.g., polysilicon, etc.) may have different etch rates when exposed to an etching solution. For example, in a process of forming a monolithic pillar in a 3D semiconductor device, the SGS and the CG may form recesses, while the SGD may remain less recessed or even not recessed. These doping configurations may thus enable selective etching into the distinct tiers (e.g., SGS, CG, and SGD) in the 3D semiconductor device by using an etching solution (e.g., tetramethylammonium hydroxide (TMCH)).

Operating a memory cell, as used herein, includes reading from, writing to, or erasing the memory cell. The operation of placing a memory cell in an intended state is referred to herein as "programming," and can include both writing to or erasing from the memory cell (i.e., the memory cell may be programmed to an erased state).

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. If two elements are shown in the drawings with a line connecting them, the two elements can be either be coupled, or directly coupled, unless otherwise indicated.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

Example 1 is a storage system comprising: a memory array; a random access memory; and a memory controller, wherein the memory controller is programmed to perform operations comprising: generating an encoded physical address using a run length encoding (RLE) algorithm on a physical address of the memory array to reduce a length of the encoded physical address; and storing the encoded physical address as a map entry in the random access memory.

In Example 2, the subject matter of Example 1 is optionally configured such that the map entry is included in a cached host device logical-to-physical (L2P) table.

In Example 3, the subject matter of Example 1 or Example 2 is optionally configured such that using the RLE algorithm includes removing reserved bits from the physical address.

In Example 4, the subject matter of Example 1 or Example 2 is optionally configured such that using the RLE algorithm includes removing static bits from the physical address.

In Example 5, the subject matter of any of Examples is optionally configured such that storing the encoded physical address includes using a first-in, first-out (FIFO) structure.

In Example 6, the subject matter of any of Examples 1-5 is optionally configured such that the memory controller is configured to: retrieve a map page from remote storage; pack the map page into a reduced-sized packed map page by generating encoded physical addresses using the run length encoding (RLE) algorithm on each physical address in the map page; and store the packed map page in the random access memory.

In Example 7, the subject matter of Example 6 is optionally configured such that the memory controller is configured to: store a length and an address of the packed map page in the random access memory.

In Example 8, the subject matter of Example 6 is optionally configured such that the memory controller is configured to: retrieve the packed map page from the random access memory; and unpack the packed map page by translating encoded physical addresses using the run length encoding (RLE) algorithm to obtain each physical address.

Example 9 is a method comprising: generating, by a memory controller, an encoded physical address using a run length encoding (RLE) algorithm on a physical address to reduce a length of the encoded physical address; and storing, by the memory controller, the encoded physical address as a map entry in a random access memory of the memory controller.

In Example 10, the subject matter of Example 9 is optionally configured such that the map entry is included in a cached logical-to-physical (L2P) table.

In Example 11, the subject matter of Example 9 or Example 10 is optionally configured such that using the RLE algorithm includes removing reserved bits from the physical address.

In Example 12, the subject matter of Example 9 or Example 10 is optionally configured such that using the RLE algorithm includes removing static bits from the physical address.

In Example 13, the subject matter of any of Examples 9-12 is optionally configured such that storing the encoded physical address includes using a first-in, first-out (FIFO) structure.

In Example 14, the subject matter of any of Examples 9-13 is optionally configured to comprise: retrieving a map page from remote storage; packing the map page into a reduced-sized packed map page by generating encoded physical addresses using the run length encoding (RLE) algorithm on each physical address in the map page; and storing the packed map page in the random access memory.

In Example 15, the subject matter of Example 14 is optionally configured to comprise: storing a length and an address of the packed map page in the random access memory.

In Example 16, the subject matter of Example 14 is optionally configured to comprise: retrieving the packed map page from the random access memory; and unpacking the packed map page by translating encoded physical addresses using the run length encoding (RLE) algorithm to obtain each physical address.

Example 17 is a device readable storage medium that provides instructions that, when executed by a processor cause the processor to perform operations comprising: generating an encoded physical address using a run length encoding (RLE) algorithm on a physical address to reduce a length of the encoded physical address; and storing the encoded physical address as a map entry in a random access memory.

In Example 18, the subject matter of Example 17 is optionally configured such that the map entry is included in a cached logical-to-physical (L2P) table.

In Example 19, the subject matter of Example 17 or Example 18 is optionally configured such that using the RLE algorithm includes removing reserved or static bits from the physical address.

In Example 20, the subject matter of any of Examples 17-19 is optionally configured such that storing the encoded physical address includes using a first-in, first-out (FIFO) structure.

Example 21 is at least one machine-readable medium including instructions that, when executed by processing circuitry, cause the processing circuitry to perform operations to implement of any of Examples 1-20.

Example 22 is an apparatus comprising means to implement of any of Examples 1-20.

Example 23 is a system to implement of any of Examples 1-20.

Example 24 is a method to implement of any of Examples 1-20.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1,72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A storage system comprising:
a memory array;
a map automation logic;
a random access memory; and
a memory controller, wherein the memory controller is programmed to perform operations comprising:
generating an encoded physical address using a run length encoding (RLE) algorithm on a physical address of the memory array to reduce a length of the encoded physical address, wherein the RLE algorithm is based on differences from a current logical block address (LBA) to a next sequential LBA;
storing the encoded physical address as a map entry in the random access memory; and
using the map automation logic to compress and read the map entry, including performing a local unpacking and discarding intermediate results.

2. The storage system of claim 1, wherein the map entry is included in a cached logical-to-physical (L2P) table.

3. The storage system of claim 1, wherein using the RLE algorithm includes removing reserved bits from the physical address.

4. The storage system of claim 1, wherein using the RLE algorithm includes removing static bits from the physical address.

5. The storage system of claim 1, wherein storing the encoded physical address includes using a first-in, first-out (FIFO) structure.

6. The storage system of claim 1, wherein the memory controller is programmed to perform operations comprising:
retrieving a map page from remote storage;
packing the map page into a reduced-sized packed map page by generating encoded physical addresses using the run length encoding (RLE) algorithm on each physical address in the map page; and
storing the packed map page in the random access memory.

7. The storage system of claim 6, wherein the memory controller is programmed to perform operations comprising:
storing a length and an address of the packed map page in the random access memory.

8. The storage system of claim 6, wherein the memory controller is programmed to perform operations comprising:
retrieving the packed map page from the random access memory; and
unpacking the packed map page by translating encoded physical addresses using the run length encoding (RLE) algorithm to obtain each physical address.

9. A method comprising:
generating, by a memory controller, an encoded physical address using a run length encoding (RLE) algorithm on a physical address to reduce a length of the encoded physical address, wherein the RLE algorithm is based on differences from a current logical block address (LBA) to a next sequential LBA;
storing, by the memory controller, the encoded physical address as a map entry in a random access memory of the memory controller; and
compressing and reading the map entry, by map automation logic, including performing a local unpacking and discarding intermediate results.

10. The method of claim 9, wherein the map entry is included in a cached logical-to-physical (L2P) table.

11. The method of claim 9, wherein using the RLE algorithm includes removing reserved bits from the physical address.

12. The method of claim 9, wherein using the RLE algorithm includes removing static bits from the physical address.

13. The method of claim 9, wherein storing the encoded physical address includes using a first-in, first-out (FIFO) structure.

14. The method of claim 9, further comprising:
retrieving a map page from remote storage;
packing the map page into a reduced-sized packed map page by generating encoded physical addresses using the run length encoding (RLE) algorithm on each physical address in the map page; and
storing the packed map page in the random access memory.

15. The method of claim 14, further comprising:
storing a length and an address of the packed map page in the random access memory.

16. The method of claim 14, further comprising:
retrieving the packed map page from the random access memory; and
unpacking the packed map page by translating encoded physical addresses using the run length encoding (RLE) algorithm to obtain each physical address.

17. A non-transitory computer readable storage medium comprising instructions thereon that, when executed by a processor, cause the processor to perform operations comprising:
generating an encoded physical address using a run length encoding (RLE) algorithm on a physical address to reduce a length of the encoded physical address, wherein the RLE algorithm is based on differences from a current logical block address (LBA) to a next sequential LBA;
storing the encoded physical address as a map entry in a random access memory; and
using map automation logic to compress and read the map entry, including performing a local unpacking and discarding intermediate results.

18. The non-transitory computer readable storage medium of claim 17, wherein the map entry is included in a cached logical-to-physical (L2P) table.

19. The non-transitory computer readable storage medium of claim 17, wherein using the RLE algorithm includes removing reserved or static bits from the physical address.

20. The non-transitory computer readable storage medium of claim 17, wherein storing the encoded physical address includes using a first-in, first-out (FIFO) structure.

* * * * *